United States Patent
Kim et al.

(10) Patent No.: US 8,687,437 B2
(45) Date of Patent: Apr. 1, 2014

(54) WRITE ASSIST CIRCUITRY

(75) Inventors: Young Seog Kim, Pleasanton, CA (US); Young Suk Kim, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 169 days.

(21) Appl. No.: 13/111,231

(22) Filed: May 19, 2011

(65) Prior Publication Data

US 2012/0134220 A1 May 31, 2012

Related U.S. Application Data

(60) Provisional application No. 61/418,256, filed on Nov. 30, 2010.

(51) Int. Cl.
*G11C 7/00* (2006.01)

(52) U.S. Cl.
USPC .................................................. 365/189.11

(58) Field of Classification Search
USPC .......................................... 365/189.011–208
See application file for complete search history.

(56) References Cited

U.S. PATENT DOCUMENTS

| 5,901,105 | A | * | 5/1999 | Ong et al. | 365/230.06 |
| 5,999,480 | A | * | 12/1999 | Ong et al. | 365/230.06 |
| 6,178,122 | B1 | | 1/2001 | Tomishima et al. | |
| 2002/0000837 | A1 | * | 1/2002 | Keeth et al. | 327/51 |

FOREIGN PATENT DOCUMENTS

JP  S629587  1/1987

* cited by examiner

*Primary Examiner* — Harry W Byrne
(74) *Attorney, Agent, or Firm* — Lowe Hauptman & Ham, LLP

(57) ABSTRACT

A circuit includes a word line driver for driving a world line and a tracking word line driver for driving a tracking word line. The pulse width of a world line signal on the world line is driven to be larger than that of a tracking world line signal on the tracking world line to assist writing under difficult conditions. Because the tracking word line signal is activated later than the word line signal being activated but is deactivated at the same time with the word line, the pulse width of the word line signal is larger.

12 Claims, 9 Drawing Sheets

US 8,687,437 B2

WRITE ASSIST CIRCUITRY

CROSS-REFERENCE TO RELATED APPLICATIONS

The present application claims priority of U.S. Provisional Patent Application Ser. No. 61/418,256, filed on Nov. 30, 2010, which is incorporated herein by reference in its entirety.

FIELD

The present disclosure is related to a write assist circuitry.

BACKGROUND

Due to manufacturing variations, both N-type and P-type Metal Oxide Silicon transistors (i.e., NMOS and PMOS transistors) in different wafers have different driving capabilities or different operational currents. A transistor is called "fast" ("F") if the transistor has a driving capability higher than that of a normal or an average transistor. In contrast, a transistor is "slow" ("S") if the transistor has a driving capability lower than that of an average transistor. Commonly, the symbols FF, FS, SF, and SS refer to fast NMOS fast PMOS, fast NMOS slow PMOS, slow NMOS fast PMOS, and slow NMOS slow PMOS transistors, respectively.

Writing data to a Static Random Access Memory (SRAM) in many situations is involved with changing the data already stored in the memory storage node, and is generally based on a pulse width of a word line. At some "difficult" conditions, including, for example, when the transistors are SS and SF and writing is performed at some particular operational voltages, and/or temperatures, changing the data is difficult. For another example, in some approaches, a VDDA power supply drives the PMOS or the pull up side, and a VDD power supply drives the NMOS or the pull down side of the memory cell. When voltage VDDA is greater than voltage VDD, the PMOS side causes difficulty to flip the data to effectively write the data to the memory storage node. Increasing the pulse width of the word line improves the situations, but also reduces the operational frequencies.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
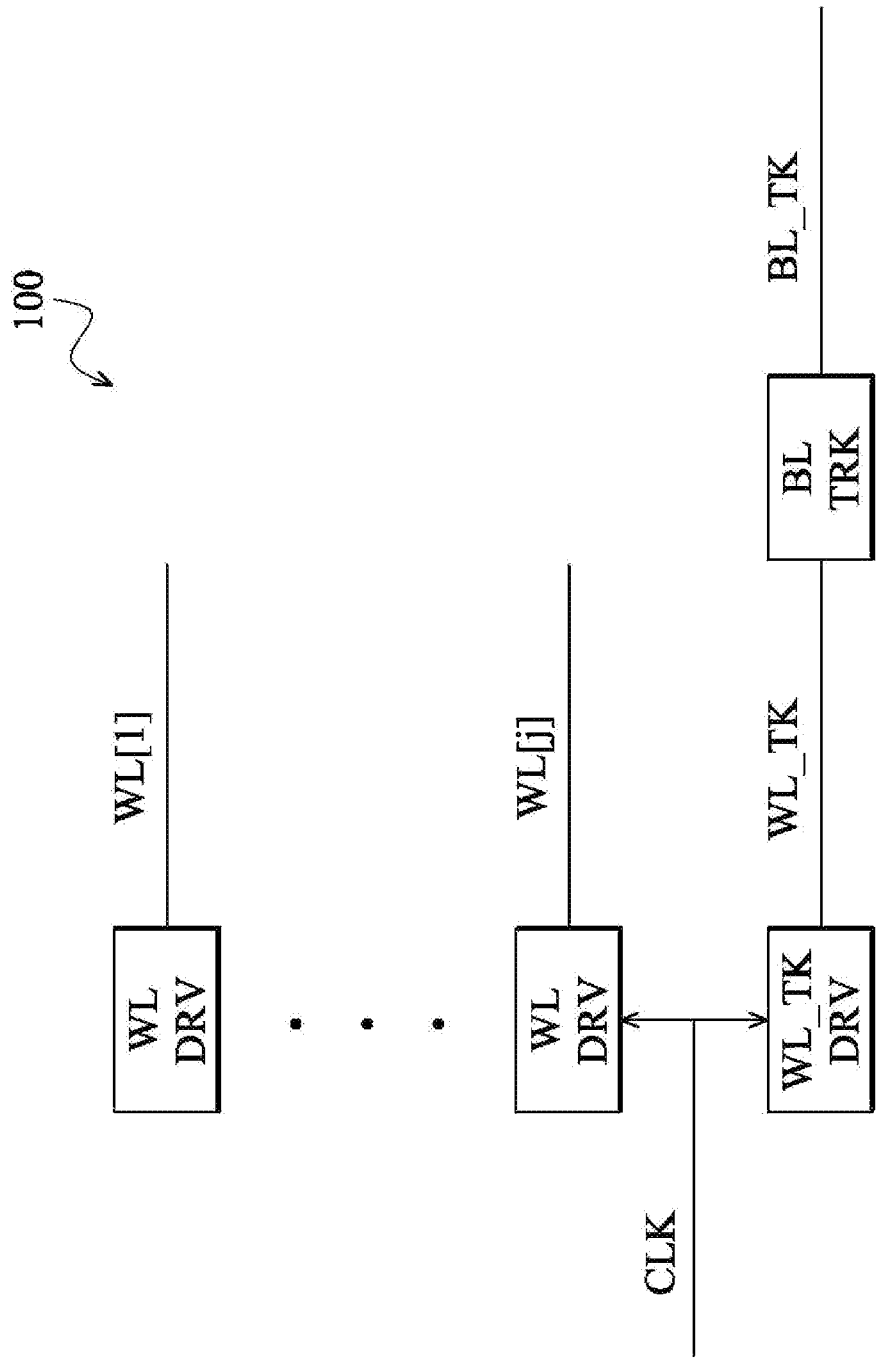
FIG. 1 is a diagram of a structure illustrating how a tracking word line and various word lines are driven, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. In some embodiments, mechanisms are provided to increase the write time so that writing at "difficult" transistor speed, voltage, and/or temperature corners is improved without much compromise to the operational frequency at other corners. In some embodiments, increasing the pulse width of a word line increases the write time.

Exemplary Circuit

FIG. 1 is a diagram of a structure 100 illustrating how j number of word lines WL[1] to word line[j], tracking word line WL_TK, and tracking bit line BL_TK, are arranged, in accordance with some embodiments. In the illustrative embodiments of FIG. 1, word lines WL, tracking word line WL_TK, and tracking bit line BL_TK are used in a Static Random Access Memory (SRAM) in a manner known in the art. For example, a word line WL[j] is used to select a row j of memory cells in a memory array, and tracking word line WL_TK is used to enable tracking bit line BL_TK. In the description below, the same symbol is used interchangeably to denote both the line and the signal thereon. For example, WL_TK is used interchangeably to denote both the tracking word line and the tracking word line signal thereon.

In some embodiments, an SRAM includes one tracking word line WL_TK and a plurality of word lines WL, and a tracking word line WL_TK corresponds to a plurality of memory cells in a row. A word line WL[j] also corresponds to a plurality of memory cells in the same row. Further, in a write operation for data to be written to a memory cell, a word line WL[j] is activated while other word lines are deactivated.

Word line driver WL DRV and tracking word line driver WL_TK DRV receive as an input clock CLK, and generate a selected word line WL[j] and tracking word line WL_TK, respectively. In some embodiments, word line driver ("driver") WL DRV and tracking word line driver ("tracking driver") WL_TR DRV have similar circuitry to generate the respective word line WL[j] and tracking word line WL_TK. Tracking driver WL_TR DRV, however, includes additional circuitry that causes word line driver WL DRV to generate a word line WL[j] having a pulse width larger than that of tracking word line WL_TK. As a result, writing at difficult corners is resolved. Those corners include, for example, when the transistors are SS or SF, the operational voltage VDDA of a memory cell is greater than the operational voltage VDD of a peripheral circuit, and at lower operational temperature of −40° C.

Bit line tracking circuit BL_TRK receives as an input signal WL_TK and generates signal bit line tracking BL_TK based on which word line WL[j] and tracking word line WL_TK are disabled. For example, initially, the rising edge of word line WL[j] and the rising edge of tracking word line WL_TK are generated. A bit line split then starts to develop. After the bit line split is sufficiently large to be amplified by an amplifier, bit line tracking circuit BL_TRK generates signal BL_TK based on which word line WL[j] and tracking word line WL_TK are disabled (e.g., driven Low).

Word Line Driver Circuit

Figure 2:
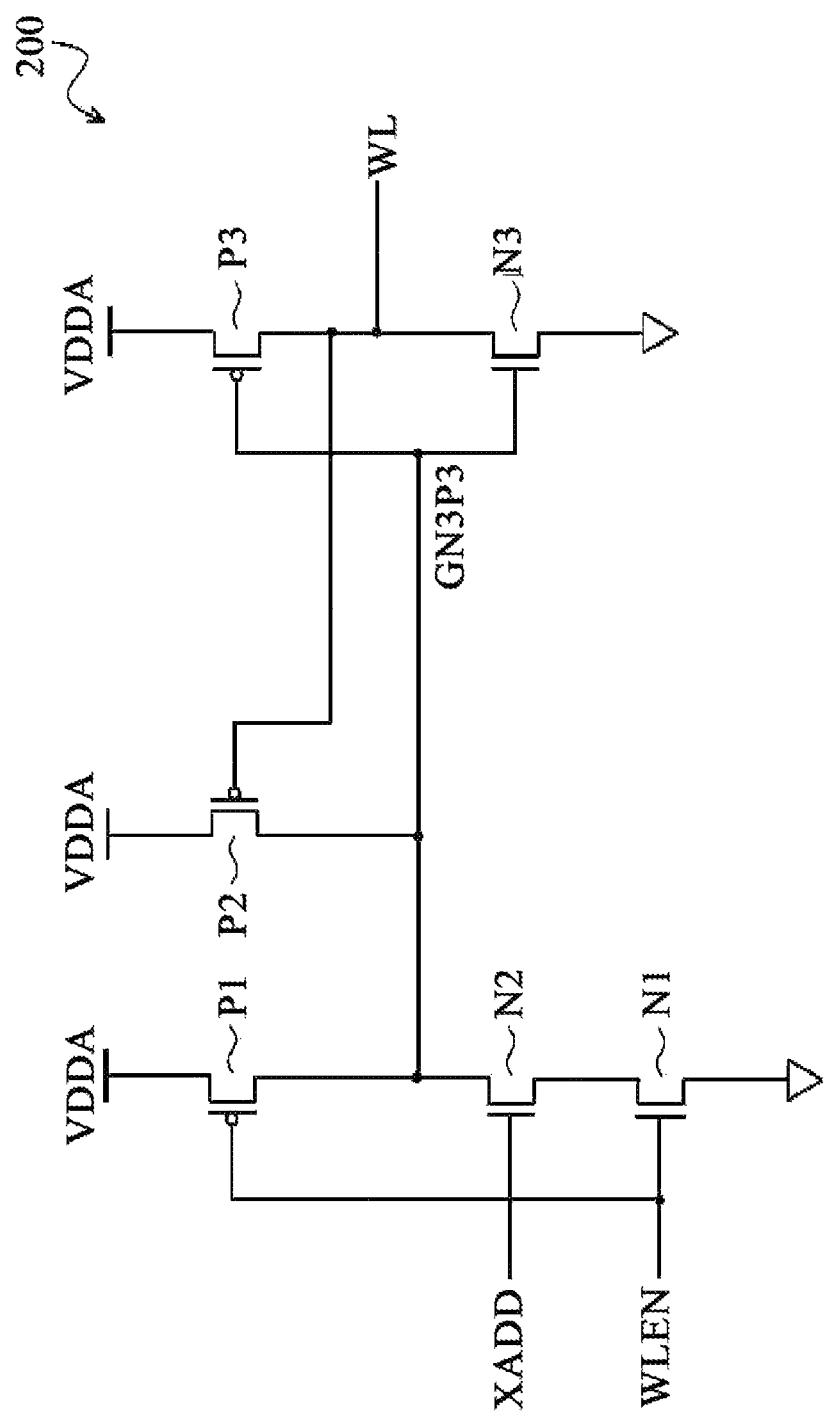
FIG. 2 is a detailed circuit of the word line driver in the structure of FIG. 1, in accordance with some embodiments.

FIG. 2 is a diagram of a circuit 200 illustrating the details of a word line driver WL DRV, in accordance with some embodiments. Signal XADD is used to enable word line WL[j] selected, for example, for writing. Signal WLEN defines the enabled time for the selected word line WL[j].

For simplicity, clock CLK is not shown, but signal WLEN, in some embodiments, is the results of a logical operation AND on clock CLK and a memory block selection signal (not shown). In some embodiments, circuit 100 operates in two different power domains, e.g., the VDD (not shown) domain and the VDDA domain. Further, signal XADD is generated in the VDD domain. As a result, the driving capability of NMOS transistor N2 depends on voltage VDD. In contrast, signal WLEN is generated in the VDDA domain and the driving capability of NMOS transistor N1 depends on voltage VDDA. Further, because transistors P1 and P2 are operated by voltage VDDA, the driving capabilities of transistors P1 and P2 also depend on voltage VDDA. In some embodiments, voltage VDDA is greater than voltage VDD.

Signal WLEN is called the word line enable signal because, for example, when transistor N2 is on, if signal WLEN is enabled (e.g., driven High), transistor N1 is turned on. NMOS transistors N1 and N2 being on causes node GN3P3 to be Low and word line WL[j] to be High (e.g., enabled). But if signal WLEN is Low (e.g., disabled), both transistors N1 and N2 act as open circuits. Node GN3P3 is pulled up towards the operational voltage VDDA of transistor P1, which is High. As a result, word line WL[j] is Low (e.g., disabled).

The gates of NMOS transistor N1 and PMOS transistor P1 are tied together and are driven by the same signal WLEN. As a result, when transistor N1 is on, transistor P1 is off. But when transistor N1 is off, transistor P1 is on. Transistor P1 together with transistors N1 and N2 provide the voltage level at node GN3P3. For example, when both transistors N1 and N2 are on, the voltage level at node GN3P3 is pulled down towards ground or the low voltage level at the source of transistor N1. When transistor P1 is on and at least one of transistors N1 and N2 is off, both transistors N2 and N1 act as an open circuit. As a result, the voltage level at node GN3P3 is pulled towards the operational voltage VDDA of transistor P1, which is High.

The voltage level at node GN3P3 turns on or off NMOS transistor N3 and PMOS transistor P3 from which the voltage level for word line WL[j] is generated. For example, when node GN3P3 is Low, PMOS transistor P3 is on, and NMOS transistor N3 is off. As a result, word line WL[j] is pulled towards the voltage level of operational voltage VDDA of transistor P3. In contrast, when node GN3P3 is High, PMOS transistor P3 is off, and NMOS transistor N3 is on. As a result, word line WL[j] is pulled towards the source of transistor N3, which is ground or Low.

Transistor P2 is a voltage keeper. For example, transistor P2, in some embodiments, holds the voltage level at node GN3P3 to a Low in unselected drivers of a memory array. The logic level of word line WL[j] turns on or off transistor P2. For example, when word line WL[j] at the gate of PMOS transistor P2 is High, transistor P2 is off, but when word line WL[j] is Low, transistor P2 is on. In some embodiments, transistor P2 is off or on after a delay time when transistor P1 is off or on, respectively. In some embodiments, the driving capability for transistor P2 is designed so that it does not affect the transition of node GN3P3 from a High to a Low.

In some embodiments, when NMOS transistors N1 and N2 (the NMOS side) are on, and PMOS transistor P2 (the PMOS side) is also on, there is a competition for current between the NMOS side and the PMOS side, which makes it difficult for node GN3P3 to be pulled down towards the source of transistor N1. In some embodiments, mechanisms exemplarily illustrated in FIG. 3 are provided to resolve the current competition situation between the PMOS side and the NMOS side.

Tracking Word Line Driver Circuit

Figure 3:
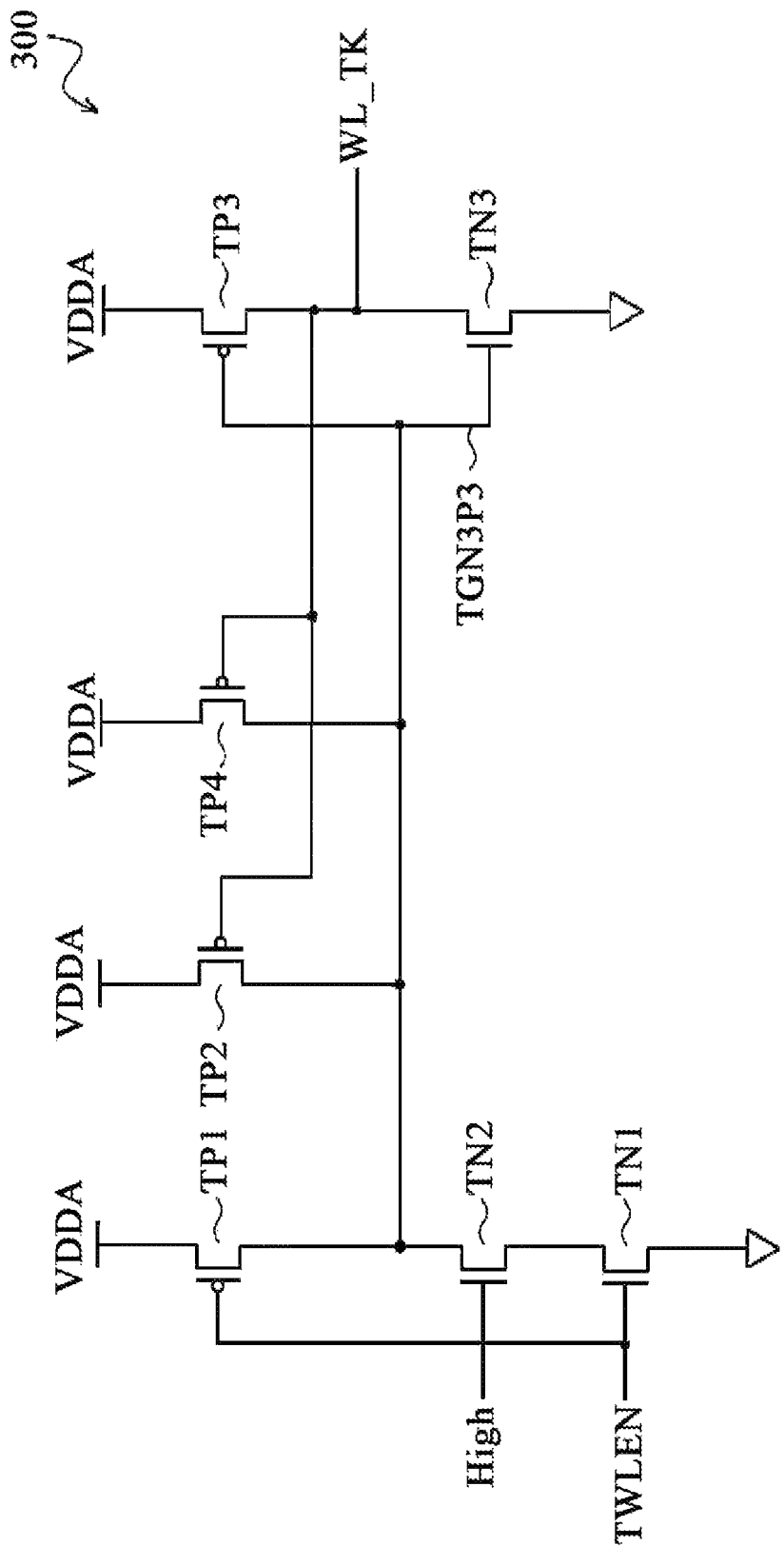
FIG. 3 is a detailed circuit of the tracking word line driver in the structure of FIG. 1, in accordance with some first embodiments.

FIG. 3 is a diagram of a circuit 300 illustrating the details of tracking driver WL_TK DRV, in accordance with some first embodiments. Tracking driver WL_TK DRV includes transistors TN1, TN2, TN3, TP1, TP2, and TP3 corresponding to and having substantially the same sizes as of those of transistors N1, N2, N3, P1, P2, and P3 of word line driver WL DRV in FIG. 2, respectively. Node TGN3P3 in circuit 300 corresponds to node GN3P3 in circuit 200, and signal TWLEN in circuit 300 corresponds to signal WLEN in circuit 200. The gate of transistor TN2, however, is tied to a High, which, in some embodiments, is voltage VDD. Tracking driver WL_TK DRV also additionally includes transistor TP4 coupled in parallel with transistor TP2. The current driving capability of transistor TP2 and TP4 or the P-side driving capability of circuit 300 is therefore larger than that of transistor P2 or the P-side driving capability of circuit 200 in FIG. 2. Because the P-side driving capability of circuit 300 is larger than that of the P-side driving capability of circuit 200, it is harder for node TGN3P3 to be pulled to the source of transistor TN1 than for node GN3P3 to be pulled to the source of transistor N1. In other words, node TGN3P3 in circuit 300 transitioning from a High to a Low takes longer than node GN3P3 transitioning from a High to a Low. As a result, tracking word line WL_TK transitioning from a Low to a High takes longer than word line WL[j] transitioning from a Low to a High. Stated differently, tracking word line WL_TK is delayed from transitioning from a Low to a High compared with word line WL[j] transitioning from a Low to a High. In other words, tracking word line WL_TK is delayed from being enabled. Because tracking word line WL_TK is delayed from being enabled, tracking word line WL_TK is delayed from being disabled. As a result, both the rising edge and the falling edge of tracking word line WL_TK are delayed. Further, the delay in the rising edge of tracking word line WL_TK also causes the delay in the falling edge of word line WL[j]. Because the rising edge of word line WL[j] remains the same while the falling edge of word line WL[j] is delayed, the pulse width WWL of word line WL[j] exemplarily illustrated in FIG. 4 is increased.

Figure 4:
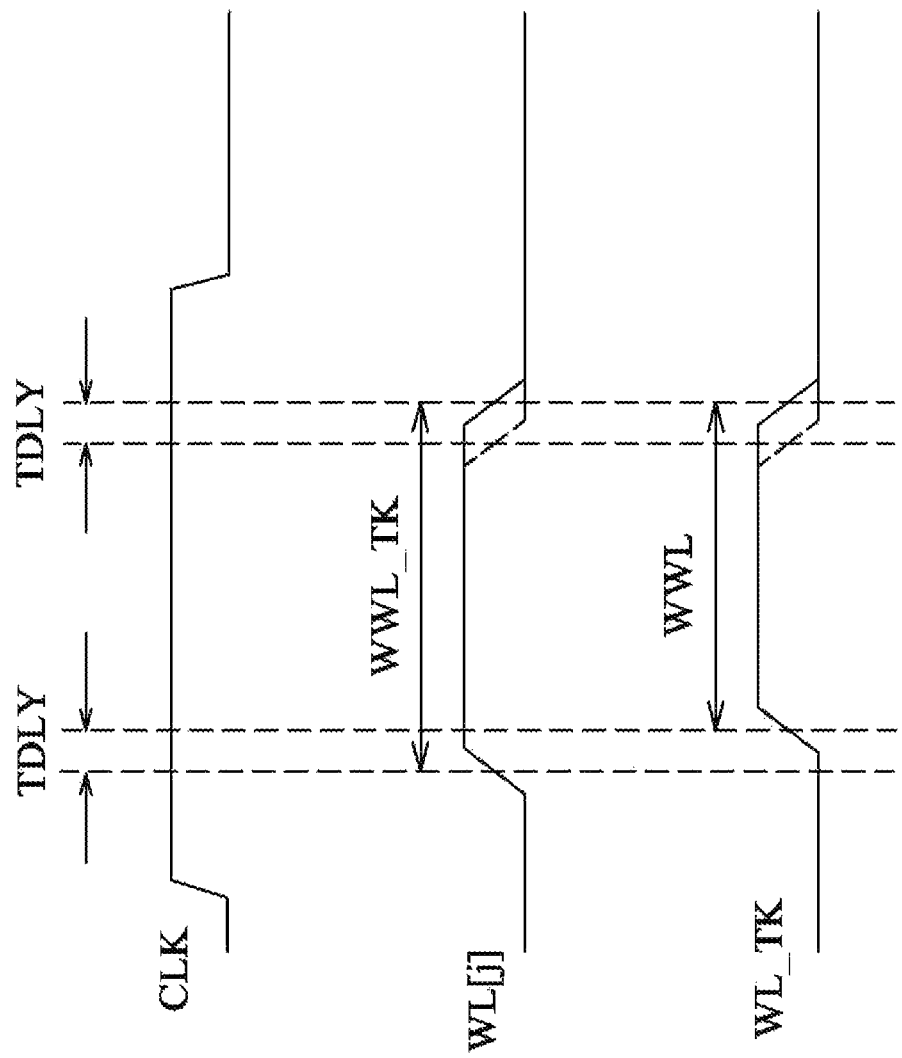
FIG. 4 is a graph of waveforms illustrating the relationship between a selected word line and the tracking word line, in accordance with some embodiments.

In some embodiments, a delay time TDLY exemplarily illustrated in FIG. 4 for tracking word line WL_TK is predetermined, and transistor TP4 is sized to achieve the predetermined delay time TDLY. For example, tracking word line WL_TK is determined to be increased by 100 pS (i.e., TDLY=100 pS). Tracking word line WL_TK signal is observed and the size of transistor TP4 is varied. As the size of transistor TP4 varies, the pulse width of tracking word line WL_TK varies. Once the predetermined increase of 100 pS is achieved, the size of transistor TP4 is selected. In some embodiments, adding transistor TP4 to tracking driver WL_TK DRV automatically assists in writing data to a memory cell at difficult conditions (e.g., in SS/SF corners, when voltage VDDA is greater than VDD, at −40° C. or below, etc.). That is, the pulse width of word line WL[j] is increased and data can be successfully written in a memory cell in those conditions.

When voltage VDDA is higher than voltage VDD, PMOS transistors TP1, TP2, TP3, and TP4 are stronger than the situations when voltage VDDA is equal to voltage VDD because voltage VGS (the voltage drop across the gate and the source of transistors TP1, TP2, TP3, and TP4) is higher. Because transistor TP4 is stronger, transistor TP4 causes a further increase in the pulse width of word line WL[j]. The larger the difference between voltage VDDA and voltage VDD, the larger the further increase in the pulse width of word line WL[j] because the larger the difference, the stronger the P-side, and thus the larger the pulse width of word line WL[j] increases.

Illustrative Waveforms

FIG. 4 is a graph of waveforms illustrating the timing relationship between a selected word line WL[j] and a tracking word line WL_TK, in accordance with some embodiments.

Clock CLK is shown to denote that word line WL[j] and tracking word line WL_TK are generated based on the same clock signal. Compared with the rising edge of word line WL[j], the rising edge of tracking word line WL_TK is delayed by a delay time TDLY. In some embodiments, because the falling edge of word line WL[j] depends on the rising edge of tracking word line WL_TK, the falling edge of word line WL[j] is also delayed by delay time TDLY. Further, the falling edge of tracking word line WL_TK also depends on the rising edge of tracking word line WL_TK. In some embodiments, when the rising edge of tracking word line WL_TK is delayed by delay time TDLY, the falling edge of tracking word line WL_TK is also delayed by delay time TDLY.

Variations of the Write Assist Circuit

Transistor TP4 is commonly called a pull up circuit because transistor TP4 adds additional pull up capability on the P side of circuit 300. Transistor TP4 is also called a write-enhancer or write-assist circuit because transistor TP4 causes an increase in the pulse width of word line WL[j] and improves writing in various conditions. Other mechanisms to provide additional pull up capability and increase the pulse width of word line WL[j] are within the scope of various embodiments, including, for example, those illustratively shown in FIGS. 5-8.

Figure 5:
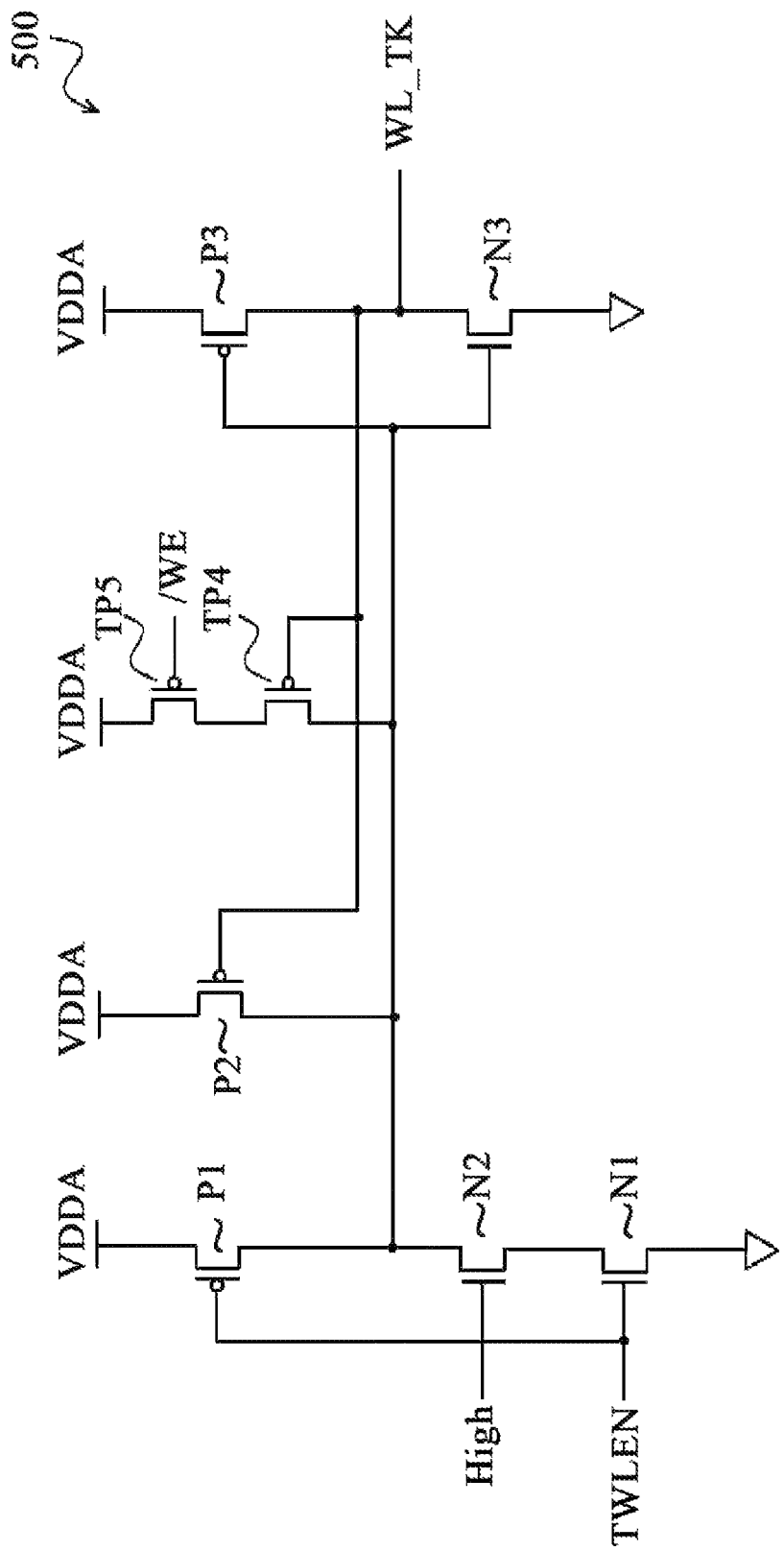
FIG. 5 is a detailed circuit of the tracking word line driver, in accordance with some second embodiments.

FIG. 5 is a diagram of a circuit 500 illustrating the details of tracking word line driver WL_TK DRV having a first variation in the write-assist circuit, in accordance with some embodiments. Compared with circuit 200, circuit 500 includes similar components, but additionally includes transistor TP5. Transistor TP5 disables or enables transistor TP4. For example, when signal /WE is applied with a Low, transistor TP5 is turned on, which, in effect, turns on or enables transistor TP4. Transistor TP4 together with transistor TP5 provides the current and thus the delay effect of transistor TP4 in circuit 300 as explained above with reference to FIG. 3. When signal /WE is applied with a High, however, transistor TP5 is turned off and acts as an open circuit. Transistor TP4, as a result, also serves as an open circuit. In other words, transistor TP4 is disabled. In some embodiments, transistor TP5 (and thus transistor TP4) is on in a write operation, but is off in a read operation. As a result, the pulse width WWL of word line WL[j] is increased during a write operation, but remains the same in a read operation.

Figure 6:
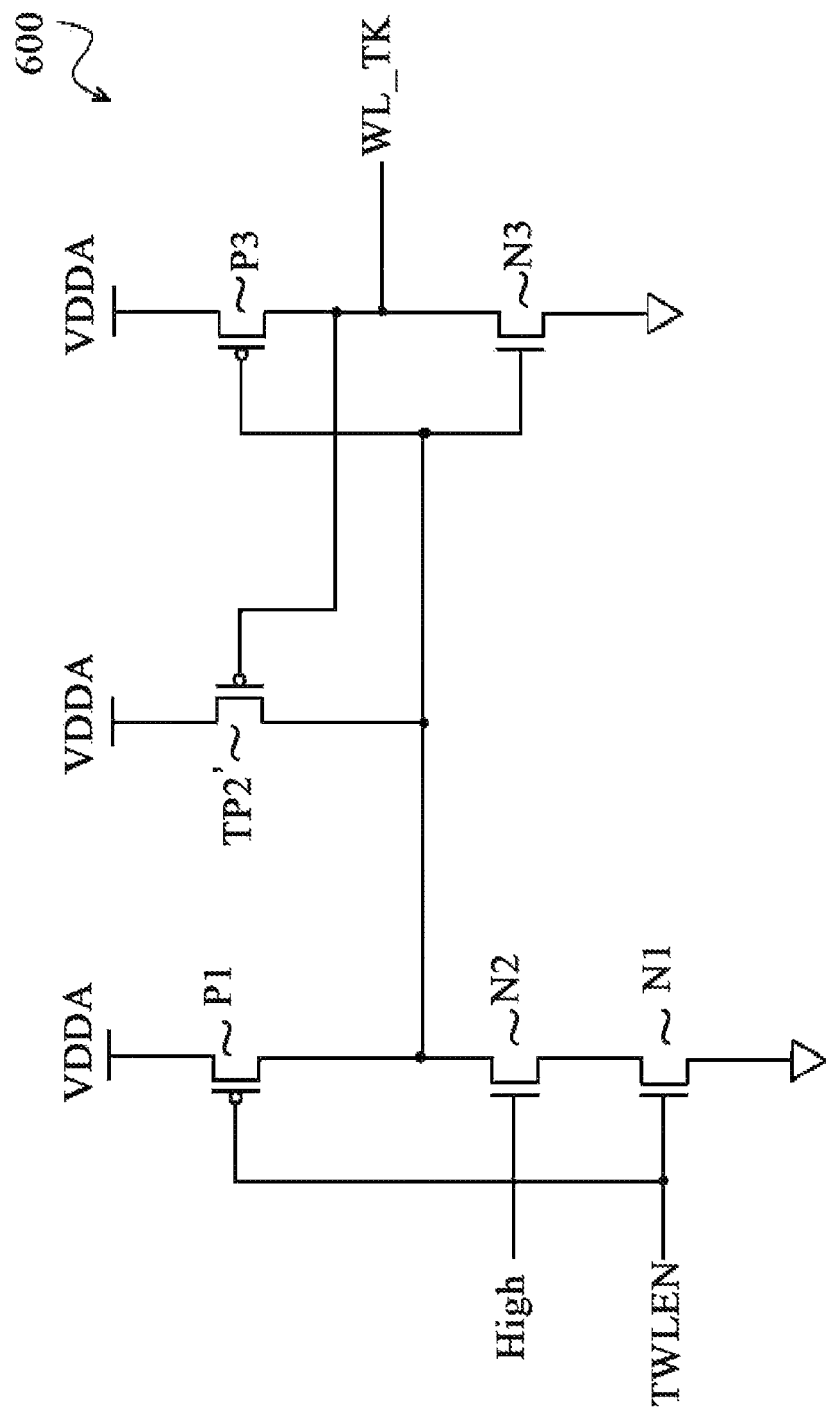
FIG. 6 is a detailed circuit of the tracking word line driver, in accordance with some third embodiments.

FIG. 6 is a diagram of a circuit 600 illustrating the details of tracking word line driver WL_TK DRV having a second variation in the write-assist circuit, in accordance with some embodiments. Circuit 600 has similar components as those of circuit 200, except that transistor TP2', which corresponds to transistor P2, is larger than transistor P2. In some embodiments, transistor TP2' is sized large enough to provide the total current provided by transistor TP2 and transistor TP4 in circuit 300. Because transistor TP2' is larger than transistor P2 and provides a larger current than transistor P2, transistor TP2' causes an increase in the pulse width of word line WL[j] similar to transistor TP4 in circuit 300 that causes the increase in the pulse width of word line WL[j].

Figure 7:
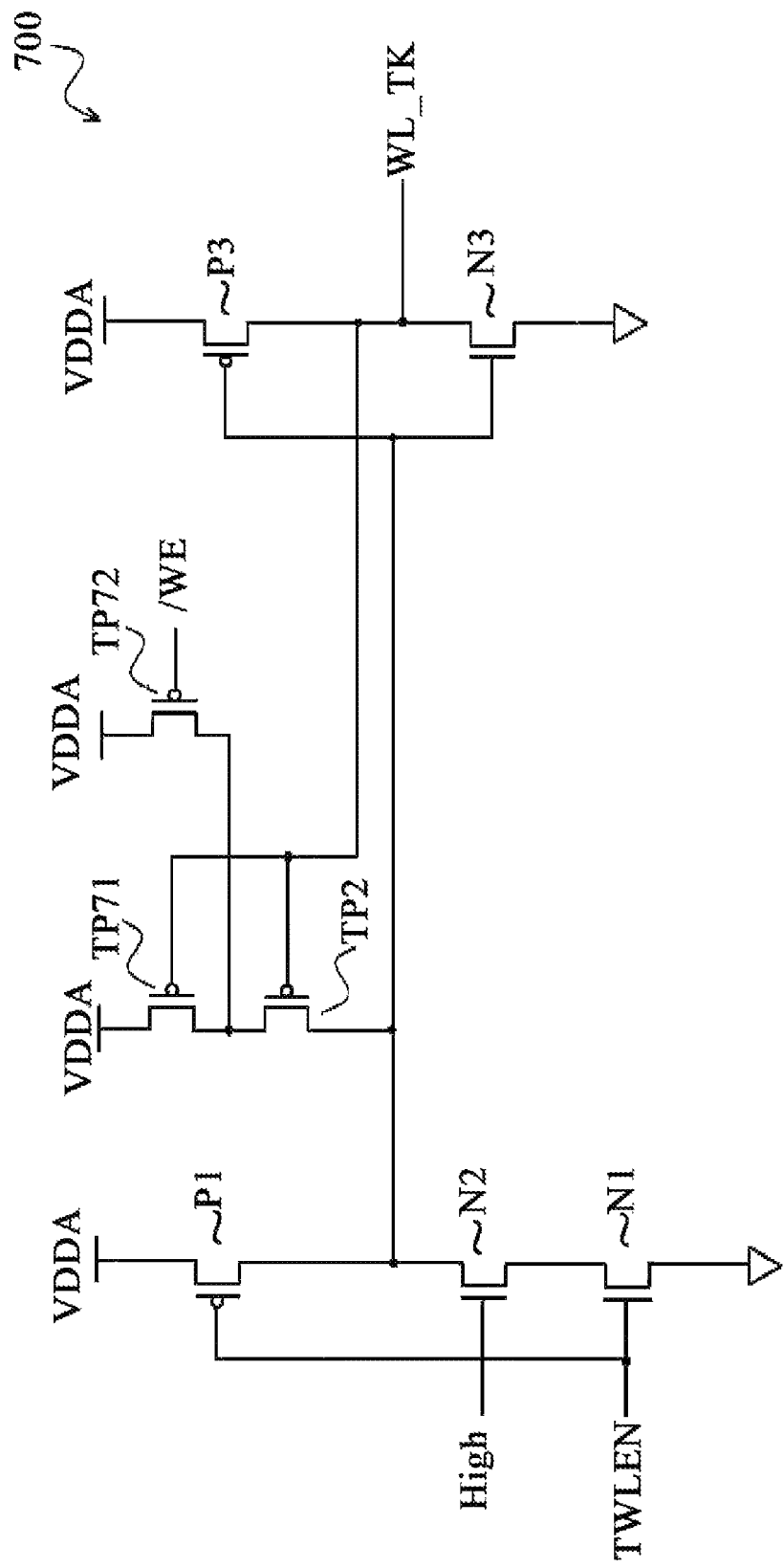
FIG. 7 is a detailed circuit of the tracking word line driver, in accordance with some fourth embodiments.

FIG. 7 is a diagram of a circuit 700 illustrating the details of tracking word line driver WL_TK DRV having a third variation in the write-assist circuit, in accordance with some embodiments. Compared with circuit 200, circuit 700 includes corresponding transistors and additionally includes transistors TP71 and TP72. The gate of transistor TP71 is coupled to the gate of transistor TP2. The drain of transistor TP71 is coupled to the source of transistor TP2 and the drain of transistor TP72. Transistor TP71 is configured to reduce the current flowing through transistors TP72 and TP2. Transistor TP72 generates additional pull up current to transistor TP2 to increase the pulse width of word line WL[j] as explained above.

Figure 8:
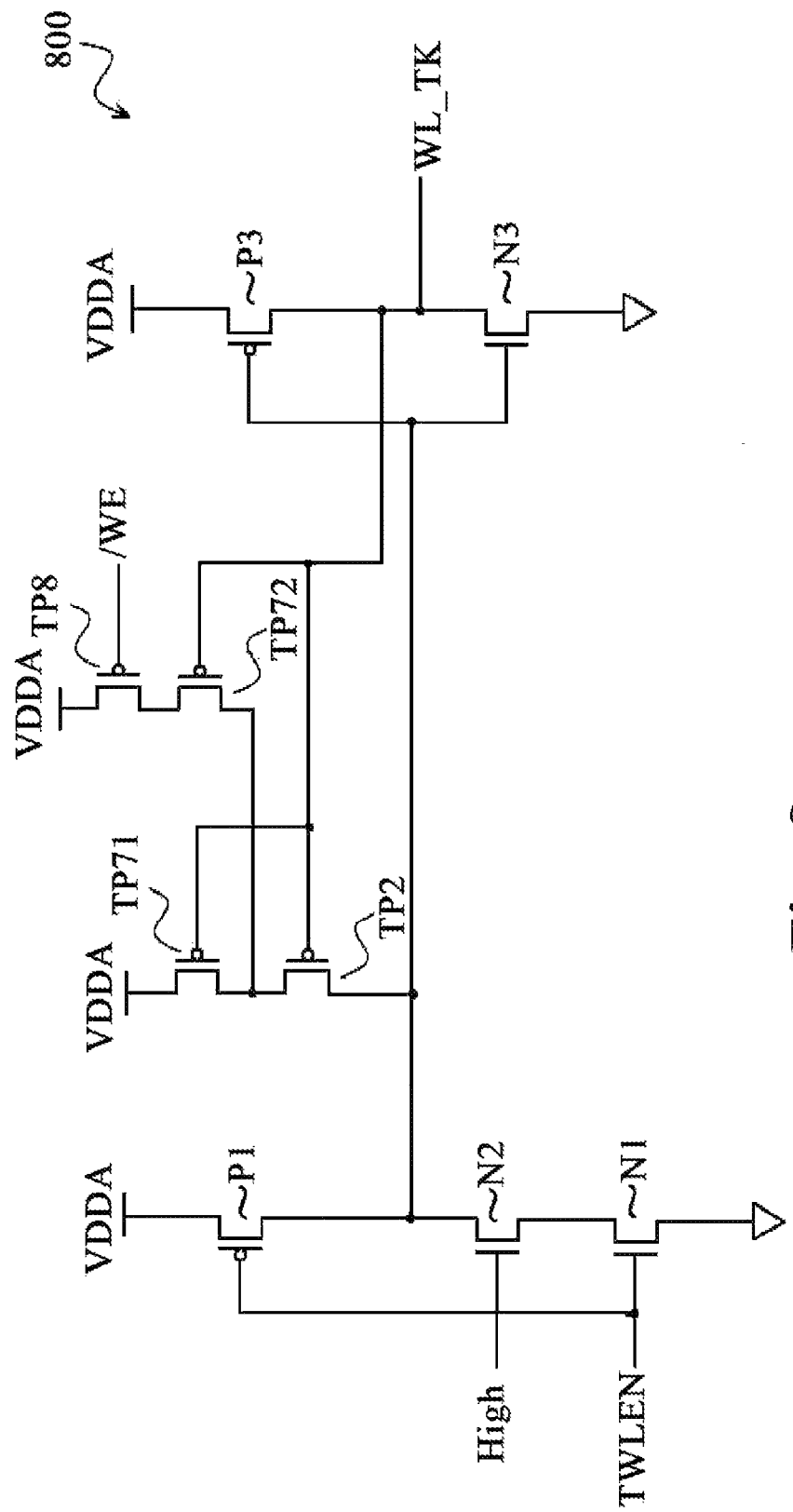
FIG. 8 is a detailed circuit of the tracking word line driver, in accordance with some fifth embodiments.

FIG. 8 is a diagram of a circuit 800 illustrating the details of tracking word line driver WL_TK DRV having a fourth variation in the write-assist circuit, in accordance with some further embodiments. Compared with circuit 700, circuit 800 includes similar components but additionally includes transistor TP8. The gate of transistor TP72, however, is coupled to the gate of transistor TP2. The drain of transistor TP8 is coupled to the source of transistor TP72. The source of transistor TP8 is coupled to operational voltage VDDA, and the gate of transistor TP8 is driven by a control signal /WE. Transistor TP8 is used to turn on or off transistor TP72. For example, when signal /WE is High, transistor TP8 is off and acts as an open circuit. As a result, transistor TP72 also acts as an open circuit. When signal /WE, however, is Low, transistor TP8 is on. Consequently, transistor TP8 and transistor TP72 provide additional pull up current to transistor TP2 to increase the pulse width of word line WL[j] as explained above.

Exemplary Method

Figure 9:
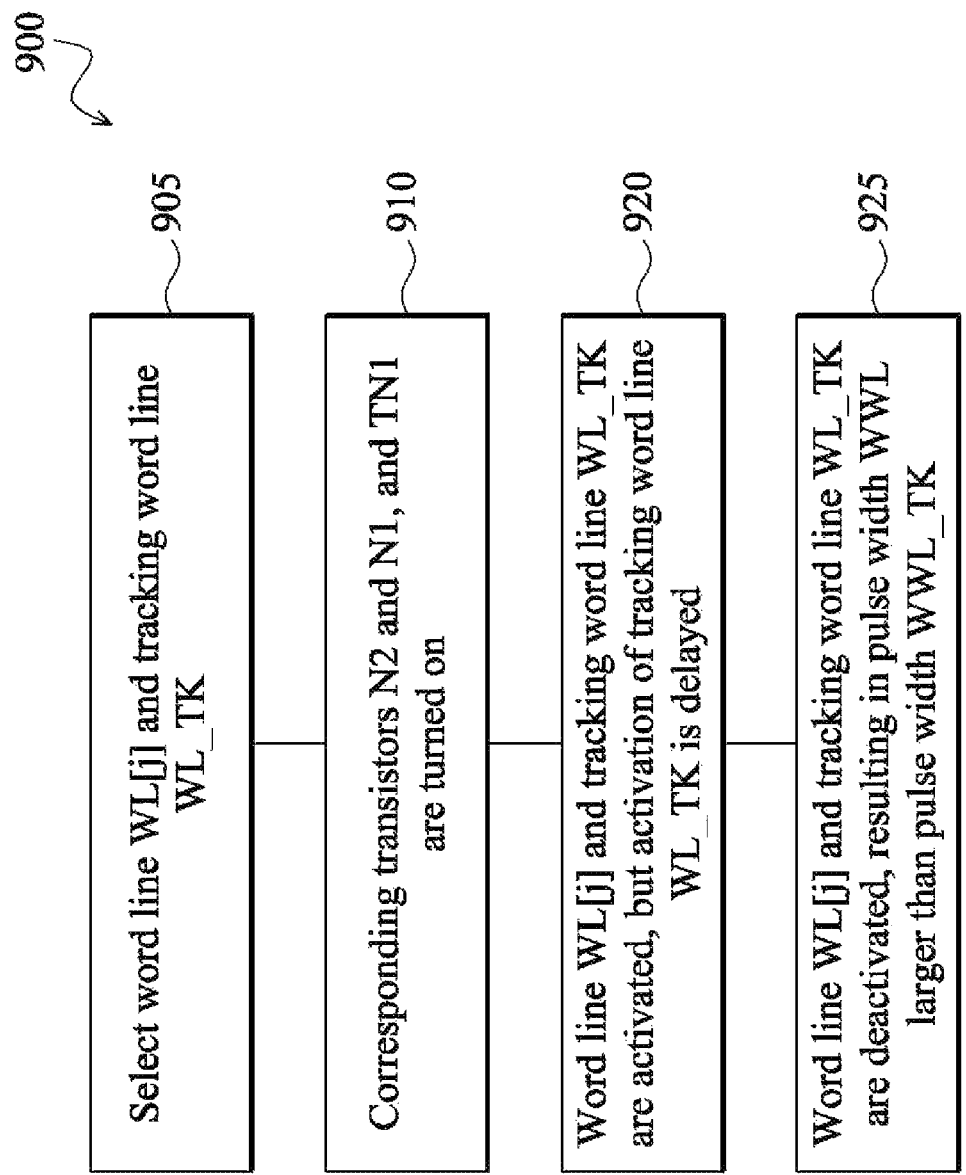
FIG. 9 is a flow chart of a method illustrating how the word line driver and the tracking word line driver generate the word line signal(s) and the tracking word line signal, respectively, in accordance with some embodiments.

FIG. 9 is a flowchart of a method 900 illustrating how word line WL[j] and tracking word line WL_TK are generated by the respective circuits 200 and 300, in accordance with some embodiments. For illustration purposes, nodes GN3P3 and TGN3P3 are initial High, and word line WL[j] and tracking word line WL_TK are therefore Low.

In step 905, word line WL[j] and tracking word line WL_TK are selected to be activated.

In step 910, signal XADD and WLEN are driven High to turn on transistors N2 and N1, respectively. At about the same time signal WLEN is driven High, signal TWLEN is also driven High to turn on transistor TN1. Transistor TN2 has been on due to the gate being coupled to a High.

In step 920, transistors N1 and N2 pull node GN3P3 to a Low, causing word line WL[j] to be activated. For example, node GN3P3 transitions from a Low to a High. Similarly, transistors TN1 and TN2 pull node TGN3P3 to a Low, causing tracking word line WL_TK to be activated. The P-side of circuit 300, however, is stronger than the P-side of circuit 200. As a result, tracking word line WL_TK is activated later than word line WL[j] being activated. In other words, tracking word line WL_TK is delayed from being activated, compared with word line WL[j] being activated. The bit line split then develops.

In step 925, after the bit line split is sufficiently developed, both word line WL[j] and tracking word line WL_TR are deactivated, resulting in pulse width WWL and WWL_TK, respectively. For illustration purposes, word line WL[j] and tracking word line WL_TK are deactivated at the same time. Because tracking word line WL_TK is activated later than word line WL[j] is activated but is deactivated at the same time with word line WL[j], pulse width WWL is larger than pulse width WWL_TK.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes. Embodiments of the disclosure are not limited to a particular type. Selecting different dopant types for a particular transistor is within the scope of various embodiments. The logic level (e.g., Low or High) of the various signals used in the above description is also for illustration purposes. Various embodiments are not limited to a particular level when a signal is activated and/or deactivated. Selecting different levels is within the scope of various embodiments.

Some embodiments regard a word line tracking driver circuit that comprises: a first NMOS transistor having a first NMOS gate, a first NMOS drain, and a first NMOS source; a second NMOS transistor having a second NMOS gate, a second NMOS drain, and a second NMOS source; a third NMOS transistor having a third NMOS gate, a third NMOS drain, and a third NMOS source; a first PMOS transistor having a first PMOS gate, a first PMOS drain, and a first PMOS source; a second PMOS transistor having a second PMOS gate, a second PMOS drain, and a second PMOS source; a third PMOS transistor having a third PMOS gate, a third PMOS drain, and a third PMOS source; and a pull up circuit coupled to the first PMOS drain. The first PMOS drain is coupled to the first NMOS drain, the second PMOS drain, the third PMOS gate, and the third NMOS gate. The first PMOS gate is coupled to the first NMOS gate. The third PMOS drain is coupled to the third NMOS drain and the second NMOS gate. The second NMOS source is coupled to the first NMOS drain. the third PMOS drain is configured to provide a tracking word line signal.

Some embodiments regard a method that comprises: generating a first pull up current at a first node in a word line driver circuit, and generating a second pull up current at a second node in a tracking word line driver circuit. The second current is higher than the first current. When the first node is at a first node high logic level, a word line generated by the word line driver circuit is at a word line low logic level, and when the first node is at a first node low logic level, the word line is at a word line high logic level. When the second node is at a second node high logic level, a tracking word line generated by the tracking word line driver is at a tracking word line low logic level, and when the second node is at a second node low logic level, the tracking word line is at a tracking word line high logic level.

Some embodiments regard a circuit that comprises a word line driver circuit and a tracking word line driver circuit. The word line driver circuit is configured to provide a word line signal and having a first node, a first circuit coupled to the first node for providing a first current having a first current value. The tracking word line driver circuit is configured to provide a tracking word line signal and having a second node, a second circuit coupled to the second node for providing a second current having a second current value different from the first current value. A value difference between the first current value and the second current value is based on a delay time between a first time when a first edge of the tracking word line signal is configured to be transitioning and a second time when a first edge of the word line is configured to be transitioning.

Some embodiments regard a method that comprises generating at a first node a transition from a first node high logic level to a first node low logic level thereby generating a transition of a word line signal from a word line low logic level to a word line high logic level; generating at a second node a transition from a second node high logic level to a second node low logic level thereby generating a transition of a tracking word line signal from a tracking word line low logic level to a tracking word line high logic level; generating a transition of the word line signal from the word line high logic level to the word line low logic level, thereby generating a word line pulse width; and generating a transition of the tracking word line signal from the tracking word line high logic level to the tracking word line low logic level, thereby generating a tracking word line pulse width. The transition of the tracking word line signal from the tracking word line low logic level to the tracking word line high logic level is later than the transition of the word line signal from the word line low logic level to the word line high logic level by a delay time. The word line pulse width is larger than the tracking word line pulse width.

The above methods show exemplary steps, but they are not necessarily performed in the order shown. Steps may be added, replaced, changed order, and/or eliminated as appropriate, in accordance with the spirit and scope of disclosed embodiments.

What is claimed is:
1. A circuit comprising:
   a word line driver circuit configured to provide a word line signal and having
      a first node; and
      a first circuit coupled to the first node and configured to provide a first current having a first current value; and
   a tracking word line driver circuit configured to provide a tracking word line signal and having
      a second node; and
      a second circuit coupled to the second node and configured to provide a second current having a second current value,
   wherein the first current value and the second current value has a current value difference based on a delay time between a first time when a first edge of the word line signal is configured to be transitioning and a second time when a first edge of the tracking word line is configured to be transitioning.
2. The circuit of claim 1, wherein
the first circuit comprises a first transistor coupled to the first node and configured to provide the first current;

the second circuit comprises a second transistor having a second gate, a second drain, and a second source, a third transistor having a third gate, a third drain, and a third source, a fourth transistor having a fourth gate, a fourth drain, and a fourth source, and a fifth transistor having a fifth gate, a fifth drain, and a fifth source;

the second drain is coupled to the second node;

the second source is coupled to the third drain and the fourth drain;

the second gate is coupled to the third gate and the fourth gate; and the fourth source is coupled to the fifth drain.

3. The circuit of claim 1, wherein the first circuit comprises a first transistor coupled to the first node and configured to provide the first current;

the second circuit comprises a second transistor having a second gate, a second drain, and a second source, a third transistor having a third gate, a third drain, and a third source, and a fourth transistor having a fourth gate, a fourth drain, and a fourth source;

the second drain is coupled to the second node;

the second source is coupled to the third drain and the fourth drain; and the second gate is coupled to the third gate.

4. The circuit of claim 1, wherein the first circuit comprises a first transistor coupled to the first node and configured to provide the first current; and the second circuit comprises a second transistor coupled to the second node and configured to provide the second current; a first size of the first transistor being different from a second size of the second transistor.

5. The circuit of claim 1, wherein the first circuit comprises a first transistor coupled to the first node and configured to provide the first current;

the second circuit comprises a second transistor having a second gate, a second drain, and a second source; a third transistor having a third gate, a third drain, and a third source; and a fourth transistor having a fourth gate, a fourth drain, and a fourth source;

the second drain is coupled to the second node;

the second gate is coupled to the third gate;

the third drain is coupled to the second node; and the third source is coupled to the fourth drain.

6. The circuit of claim 1, wherein the first circuit comprises a first transistor coupled to the first node and configured to provide the first current;

the second circuit comprises a second transistor having a second gate, a second drain, and a second source; a third transistor having a third gate, a third drain, and a third source;

the second drain is coupled to the second node;

the second gate is coupled to the third gate; and the third drain is coupled to the second node.

7. A circuit comprising:

a word line driver circuit configured to generate a word line signal in response to an input signal, the word line signal having a first transitioning edge where the word line signal transitions from a first logic level to a second logic level, a second transitioning edge where the word line signal transitions from the second logic level to the first logic level, and a word line pulse width defined by the first transitioning edge and the second transitioning edge of the word line signal; and a tracking word line driver circuit configured to generate a tracking word line signal in response to the input signal, the tracking word line signal having a first transitioning edge where the tracking word line signal transitions from the first logic level to the second logic level, a second transitioning edge where the tracking word line signal transitions from the second logic level to the first logic level, and a tracking word line pulse width defined by the first transitioning edge and the second transitioning edge of the tracking word line signal, the first transitioning edge of the tracking word line signal occurring later than the first transitioning edge of the word line signal by a predetermined delay time, and the second transitioning edge of the tracking word line signal and the second transitioning edge of the word line signal occurring at about the same time, wherein the word line driver circuit comprising:

a first circuit configured to generate the word line signal at an output node of the first circuit of the word line driver circuit; and a second circuit configured to pull, in response to the word line signal, a voltage level at an input node of the first circuit of the word line driver circuit toward one of the first logic level or the second logic level; and the tracking word line driver circuit comprising:

a first circuit configured to generate the tracking word line signal at an output node of the first circuit of the tracking word line driver circuit; and a second circuit configured to pull, in response to the tracking word line signal, a voltage level at an input node of the first circuit of the tracking word line driver circuit toward the one of the first logic level or the second logic level, and current driving capability of the second circuit of the tracking word line driver circuit being greater than current driving capability of the second circuit of the word line driver circuit.

8. The circuit of claim 7, wherein the second circuit of the word line driver circuit comprises a transistor; and the second circuit of the tracking word line driver circuit comprises a transistor, the transistor of the second circuit of the tracking word line driver circuit having a size greater than that of the transistor of the second circuit of the word line driver circuit.

9. The circuit of claim 7, wherein the second circuit of the tracking word line driver circuit comprises a plurality of transistors, the plurality of transistors of the second circuit of the tracking word line driver circuit being connected in parallel.

10. The circuit of claim 9, wherein the second circuit of the tracking word line driver circuit further comprises a switch, the switch being configured to activate, in response to a write enable signal, one of the plurality of transistors of the second circuit of the tracking word line driver circuit.

11. The circuit of claim 7, wherein the second circuit of the tracking word line driver circuit comprises:

a plurality of transistors, the plurality of transistors of the second circuit of the tracking word line driver circuit being connected in series; and a switch, the switch configured to bypass, in response to a write enable signal, one of the plurality of transistors of the second circuit of the tracking word line driver circuit.

12. The circuit of claim 7, wherein the second circuit of the tracking word line driver circuit is configured to have two or more different levels of driving capability; and the second circuit of the tracking word line driver circuit comprises a switch configured to set the second circuit of the tracking word line driver circuit to operate with one of the two or more different levels of driving capability.

* * * * *